United States Patent [19]
Serrone et al.

[11] Patent Number: 4,675,558
[45] Date of Patent: Jun. 23, 1987

[54] LOCK DETECTOR FOR BIT SYNCHRONIZER

[75] Inventors: Michael J. Serrone, Sunnyvale; Timothy P. Halloran, Cupertino; Gary L. Wagner, Menlo Park, all of Calif.

[73] Assignee: Ford Aerospace & Communications Corporation, Detroit, Mich.

[21] Appl. No.: 789,818

[22] Filed: Oct. 21, 1985

[51] Int. Cl.⁴ .............................................. H03L 7/06
[52] U.S. Cl. .................... 307/527; 307/516; 328/110; 328/117; 328/134; 331/25; 331/DIG. 2
[58] Field of Search ............... 328/115, 116, 117, 109, 328/110, 134, 155; 307/527, 511, 514, 516; 331/DIG. 2, 25

[56] References Cited

U.S. PATENT DOCUMENTS

| | | | |
|---|---|---|---|
| 3,456,196 | 7/1969 | Schneider | 331/DIG. 2 |
| 3,982,190 | 9/1976 | Schaefer | 328/110 |
| 4,000,476 | 12/1976 | Walker et al. | 331/25 |
| 4,077,016 | 2/1978 | Sanders et al. | 331/25 |
| 4,100,503 | 7/1978 | Lindsey et al. | 331/25 |
| 4,287,480 | 9/1981 | Swift et al. | 331/DIG. 2 |
| 4,316,154 | 2/1982 | Krause | 331/DIG. 2 |
| 4,362,394 | 12/1982 | Menlove | 328/110 |
| 4,375,693 | 3/1983 | Kuhn | 307/511 |
| 4,375,694 | 3/1983 | Kuhn | 328/155 |
| 4,423,390 | 12/1983 | Waters | 331/DIG. 2 |
| 4,488,120 | 12/1984 | Carsten | 331/DIG. 2 |

OTHER PUBLICATIONS

Keller et al., "Digital Lock Detector for Phase-Locked Loop Circuit", IBM Technical Disclosure Bulletin, vol. 26, No. 7A, Dec. 1983.

Primary Examiner—John S. Heyman
Attorney, Agent, or Firm—Edward J. Radlo; Keith L. Zerschling

[57] ABSTRACT

A lock detector (12) used in conjunction with a bit synchronizer (14) for determining when a random binary input signal (2) is in lock with a clock (7) generated by the bit synchronizer (14). A window comparator (3, 5; or 23, 25, 27) determines whether the amplitude of the input signal (2) is within or without an amplitude window, and generates a signal (33) as a result of said determination. This signal (33) is sampled at periodic sampling points (X, Y). The set of X sampling points and set of Y sampling points are interleaved and usually separated by half a bit period. The X samples and Y samples are averaged and compared. Means (19) are provided for declaring a lock condition when the X average exceeds the Y average by a preselected threshold ($V_{REF}$), which occurs when the X points are positioned near mid-points of data bits (35) and the Y points are positioned near data transitions (39). The circuit (12) will not lock on false sidebands and can operate at very low signal-to-noise ratios.

12 Claims, 7 Drawing Figures

LOCK DETECTOR FOR BIT SYNCHRONIZER

DESCRIPTION

1. Technical Field

This invention pertains to the field of detecting the phase lock of a random binary baseband signal onto a clock, such as a clock generated by a bit synchronizer.

2. Background Art

U.S. Pat. Nos. 3,982,190, 4,287,480, 4,375,693, and 4,375,694; and Keller et al., "Digital Lock Detector for Phase-Locked Loop Circuit", *IBM Technical Disclosure Bulletin*, Vol. 26, No. 7A, Dec. 1983, pp. 3393–3394, disclose lock detectors that detect the presence of lock by searching for transitions (or impulses in the case of U.S. Pat. No. 3,982,190) in the incoming data within a preselected time interval. None of the reference circuits consider the amplitude of the incoming signal as in the present invention.

U.S. Pat. Nos. 4,000,476, 4,077,016, and 4,423,390 describe circuits that differ from the present invention in that: (1) they are part of a demodulator, not a bit synchronizer; (2) they operate at carrier frequencies, not at baseband; and (3) they detect the presence of false lock rather than lock. The device described in U.S. Pat. No. 4,423,390 looks at frequency information, not amplitude information. The devices described in U.S. Pat. Nos. 4,000,476 and 4,077,016 look at amplitude information, but in the frequency domain, not the time domain, and only at certain frequencies.

A secondary reference is U.S. Pat. No. 4,100,503.

3. Disclosure of Invention

The present invention is a lock detector (12) that typically operates in conjunction with a bit synchronizer (14) to determine when a stream of baseband input data (2) is locked onto a clock (7) generated by the bit synchronizer (14). As used in this specification and claims, "lock" means that the input signal (2) has substantially the same frequency as, and is substantially in phase with, the reference clock (7).

The input signal (2) is any random binary signal. By "binary" is meant that the signal (2) conveys two information states, by means of high and low amplitude levels (A, −A, respectively). By "random" is meant that there is an approximately equal probability that one or the other of the information states will be present for any given data bit (35).

The instant lock detector (12) determines lock by sampling the amplitude of the input signal (2) or derivative (33) thereof at periodic points in time, usually every half bit period (of the clock (7)). The sampling points are broken into two alternating sets of points: X sampling points and Y sampling points. Means (13, 15) average the amplitudes measured at the X and Y sampling points, respectively, and means (17) compare these two averages. Lock is declared when the X average exceeds the Y average by a preselected threshold. The sampling means for the X points and Y points typically comprise flip-flops (9, 11, respectively). The flip-flops (9, 11) are clocked by the bit synchronizer clock (7) and its inverse (8), respectively. Each averaging means (13, 15) typically comprises a low pass filter.

The amplitudes that are sampled must be such that they indicate whether the input data (2) is instantaneously at a data region (35) or at a transition (39) therebetween. If the input signal (2) comprise a squarewave, it can be smoothed using a low pass filter (1). The smoothed data stream (4) is then processed by an analog-to-digital window comparator (3, 5; or 23, 25, 27), which produces a signal (33) indicating whether the instantaneous amplitude of the input signal (2) is within or without an amplitude window having a high point, lower than one half of the high amplitude level (A) and a low point higher than one half of the low amplitude level (−A).

The invention (12) is particularly well suited to avoiding the declaration of false lock on contaminated QPSK and other waveforms. The invention (12) works reliably to very low signal-to-noise ratios. In a working embodiment, the instant lock detector (12) was operable at signal-to-noise ratios less than 2dB $E_b/N_o$.

BRIEF DESCRIPTION OF THE DRAWINGS

These and other more detailed and specific objects and features of the present invention are more fully disclosed in the following specification, reference being had to the accompanying drawings, in which.

BEST MODE FOR CARRYING OUT THE INVENTION

Figure 6:
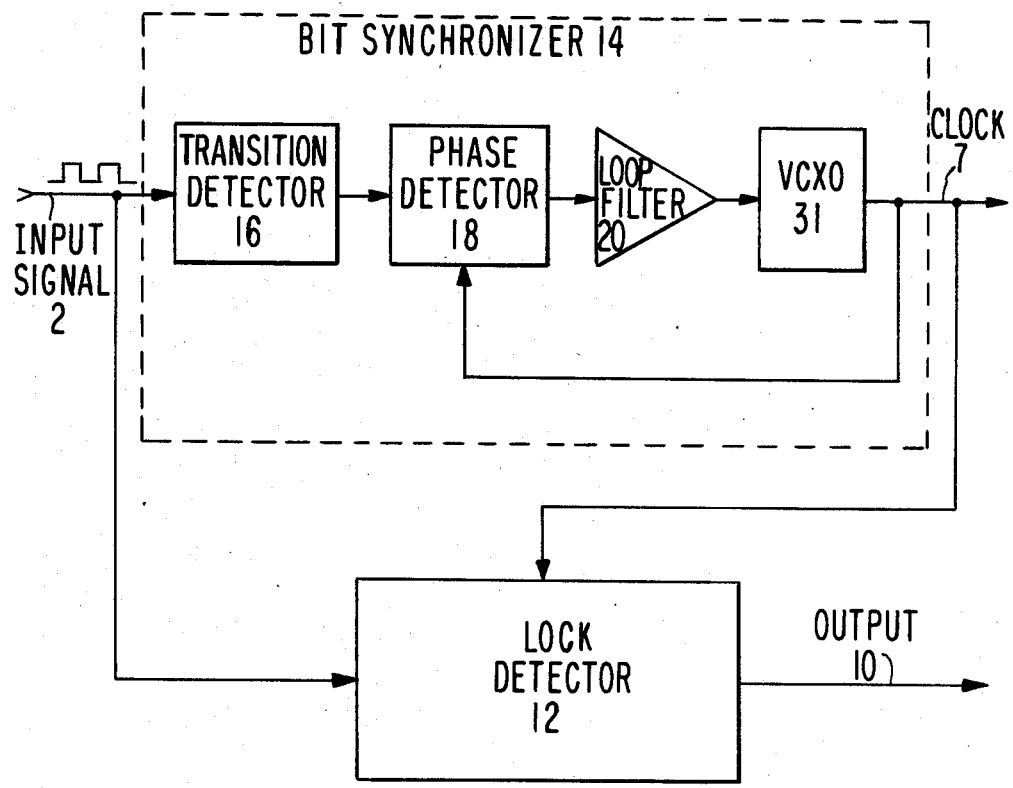
FIG. 6 is a block diagram showing the utility of the present lock detector 12 in conjunction with a bit synchronizer 14.

FIG. 6 shows the operation of the instant lock detector 12 in its preferred intended environment, working with a bit synchronizer 14. Input signal 2 is any random binary signal, at a baseband frequency after having been demodulated by a demodulator (not illustrated). Signal 2 is fed to bit synchronizer 14 and to lock detector 12. Within bit synchronizer 14, signal 2 is fed to a transition detector 16, then to a phase detector 18, a loop filter 20, and a voltage controlled oscillator 31, preferably crystal controlled (VCXO) for reasons of stability. In a phase lock loop, the output of VCXO 31, clock 7, is fed as a second input to phase detector 18, and is also fed to lock detector 12, which outputs a signal 10 indicating when lock has been achieved between signal 2 and clock 7.

Figure 1:
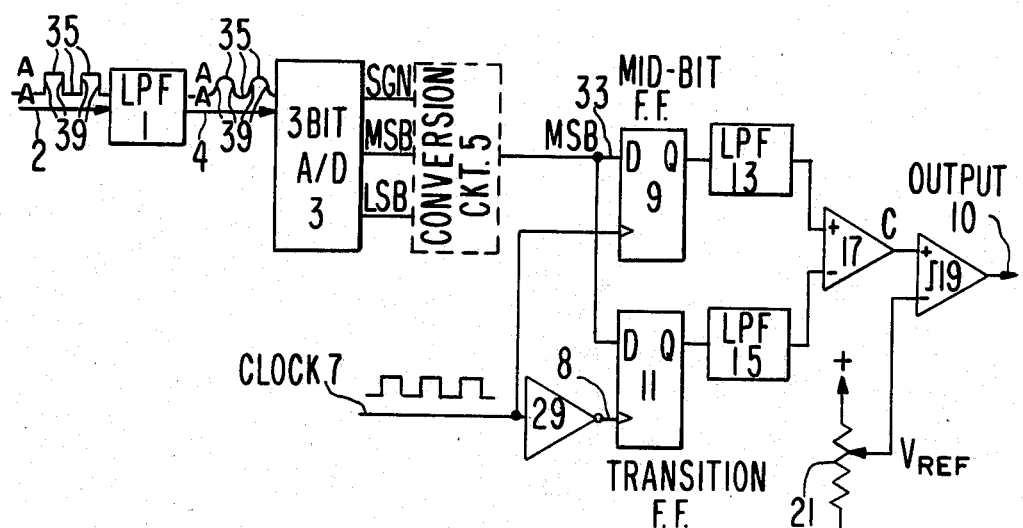
FIG. 1 is a block diagram of a first embodiment of the present invention.
Figure 3:
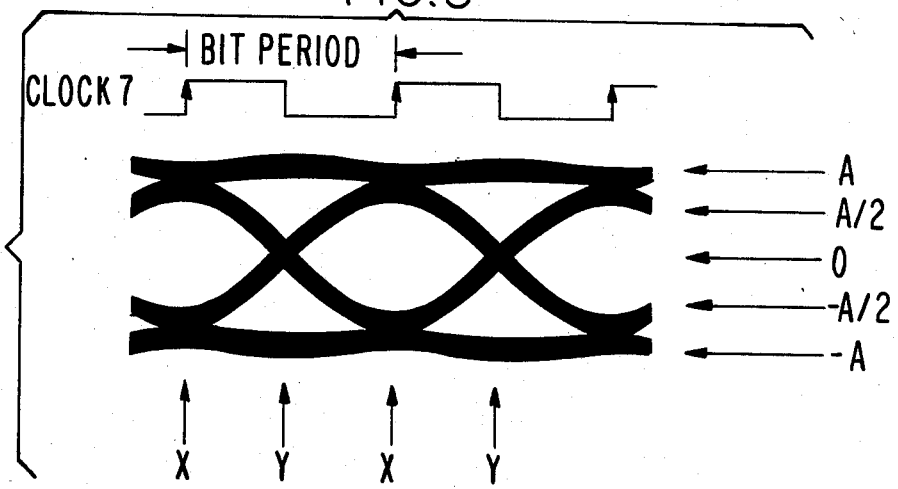
FIG. 3 is a black-white-reversed eye diagram of smoothed input data 4 showing the presence of lock.

A first embodiment of lock detector 12 is shown in FIG. 1, in which the input signal 2 is shown having periodic data regions 35 separated by transition regions 39. Signal 2 is smoothed and filtered by low pass filter 1, generating a smoothed squarewave such as is illustrated in FIG. 3. The smoothed input signal 4 has, like its precursor signal 2, a maximum amplitude of A (representing a logical "1" or "high" information state) and a minimun amplitude of −A (representing a logical "0" or "low").

Signal 4 is fed to a three-bit bipolar analog-to-digital converter 3, which digitizes the signal 4 into three levels, which it outputs: the sign (SGN), the most significant bit (MSB), and the least significant bit (LSB), respectively. A typical three-bit analog-to-digital converter 3 will produce the outputs for the indicated inputs 4 as shown in the following Table 1:

TABLE 1

| amplitude of signal 4 | SGN | MSB | LSB |
|---|---|---|---|
| A | 1 | 1 | 1 |
|   | 1 | 1 | 0 |
| A/2 |   |   |   |
|   | 1 | 0 | 1 |
|   | 1 | 0 | 0 |
| 0 |   |   |   |
|   | 0 | 0 | 1 |
|   | 0 | 0 | 0 |
| −A/2 |   |   |   |
|   | 0 | 1 | 1 |
| −A | 0 | 1 | 0 |

It can be seen from Table 1 that when the MSB is 0, the amplitude of signal 4 is less than A/2 and greater than −A/2. On the other hand, when the MSB is 1, the amplitude of signal 4 is greater than A/2 or less than −A/2. Thus the MSB is convenient way of breaking up the amplitude region of signal 4 into two equal zones of amplitude: a zone in the middle (an amplitude window) and a zone comprising high and low amplitudes (outside the window).

Conversion circuit 5 is an optional circuit (hence dashed in FIG. 1) which selects the most significant bit (MSB) from converter 3 and processes the MSB if necessary so that it may be used by remaining portions of the circuit 12. For example, if converter 3 outputs an MSB of 1 for signals 4 within the amplitude window, circuit 5 comprises an inverter, to make signal 33 zero for said window.

Signal 33 is then fed to the D inputs of each of flip-flops 9 and 11. Alternative to flip-flops, other sample and hold circuits could be used. Flip-flop 9 is designated the "mid-bit flip-flop" because when circuit 12 is in a lock condition, the rising edges of clock 7 (which are applied to the clock input of flip-flop 9) coincide with the middle (with respect to time) of each data bit 35 on the input signal 4. Flip-flop 11 is designated the "transition flip-flop" because when circuit 12 is in lock, the rising edges of clock 8 (which are applied to the clock input of flip-flop 11) coincide with the data transitions 39 of the waveform 4.

Figure 4:
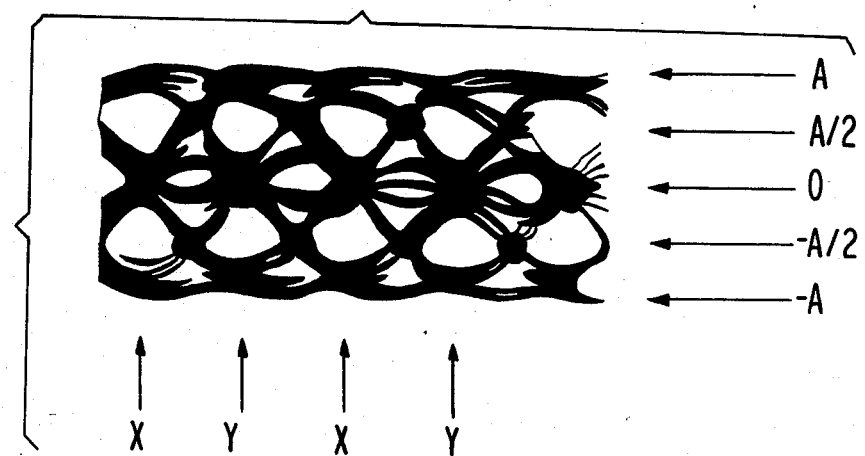
FIG. 4 is a black-white-reversed eye diagram of smoothed input data 4 from one channel of an offset QPSK waveform after demodulation, in which information from both channels is undesirably present due to sideband lock in the demodulator.
Figure 5:
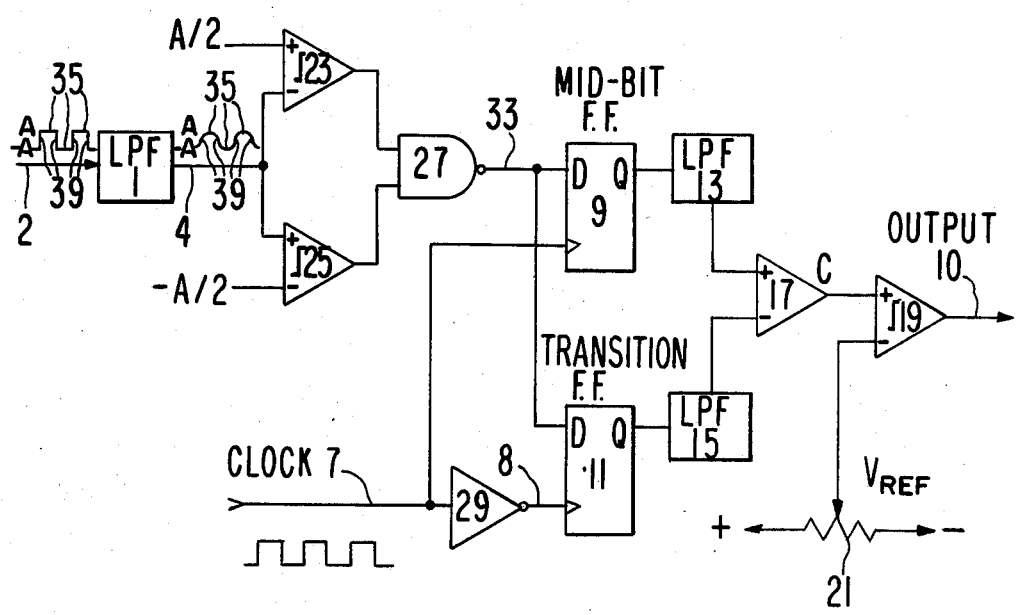
FIG. 5 is a block diagram of an alternative embodiment of the present invention.

In the exemplary circuits illustrated in FIGS. 1 and 5, clock 8 is generated from clock 7 by passing the latter through inverter 29. Thus, clock 8 is 180° out of phase with respect to clock 7, and the sampling instants generated by clock 8, which are known as sampling points Y, are one-half of a bit period apart from the sampling instants generated by clock 7, which are known as sampling points X (see FIGS. 3 and 4).

Figure 7:
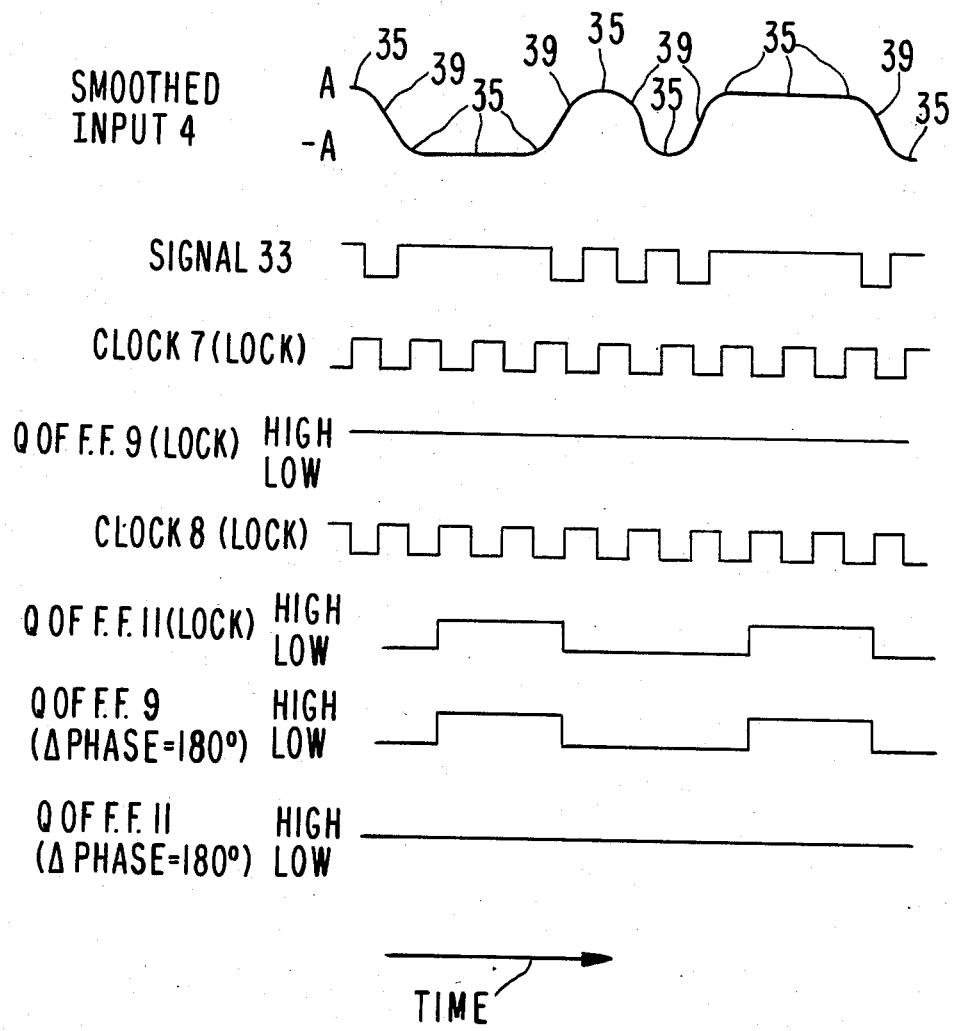
FIG. 7 is a set of timing diagrams associated with the FIGS. 1 and 5 embodiments.

Each flip-flop 9, 11 operates on the basis that for each upward transition of the clock (7 or 8) pulse connected to its clock input, whatever logical state is present at the D input will be passed to the Q output and will remain there until a subsequent upward transition is clocked into its clock input. This is best illustrated in FIG. 7, a set of timing waveforms appropriate for each of FIGS. 1 and 5. The uppermost waveform shows a typical smoothed input signal 4. The second waveform is the digitized signal 33 corresponding to that smoothed input 4. When signal 33 is high, the instantaneous amplitudes of signals 2 and 4 are outside the amplitude window. In the FIG. 1 example, this is equivalent to saying that the MSB is 1. On the other hand, when signal 33 is low, it is because the instantaneous amplitudes of signals 2 and 4 are between A/2 and −A/2, i.e., within the amplitude window.

The third waveform on FIG. 7 is that of clock 7, which is initially very close in frequency to signals 2 and 4. When circuit 12 is in lock, the frequency of clock 7 is exactly that of signals 2 and 4. In FIG. 7, clock 7 is shown as being in a lock condition, i.e., its rising edges occur at the middle of data regions 35 of signal 4 rather than at data transitions 39. This lock condition is also illustrated in FIG. 3, a reversed (black-to-white and white-to-black) tracing of signal 4 of an eye waveform appearing on a cathode ray tube, i.e., a time superimposed picture.

The fourth waveform of FIG. 7 shows that in the lock condition, the Q output of flip-flop 9 is always high. This is because the X sampling points triggered by upticks of clock 7 always occur at data regions 35, which are always amplitude +A or −A (or slightly offset therefrom because of noise) and therefore out of the amplitude window.

The next waveform of FIG. 7 shows clock 8 for the lock condition. It is always 180° out of phase with respect to clock 7.

The next waveform of FIG. 7 shows the Q output of flip-flop 11 for the lock condition. This output varies between the high and low state, depending on whether the Y sampling point (uptick of clock 8) occurs at a point of no transition or at a transition point 39, respectively. Since it is assumed that input signal 2 is random, its transition density is 50%; therefore, the average value of the signal at the Q output of flip-flop 11 is one-half the voltage representive of a logical high. This average (the "Y average") is generated by low pass filter 15, which produces an analog voltage level by averaging over a preselected relatively long time interval, such as 100 bit periods, the digital signal from the Q output of flip-flop 11. Low pass filter 15 presents the Y average to the inverting input of differential amplifier 17. Similarly, low pass filter 13, which has the same time constant and hence same averaging period as low pass filter 15, averages the value of the X sample points outputted by the Q output of flip-flop 9, and presents this "X average" to the non-inverting input terminal of differential amplifier 17.

Figure 2:
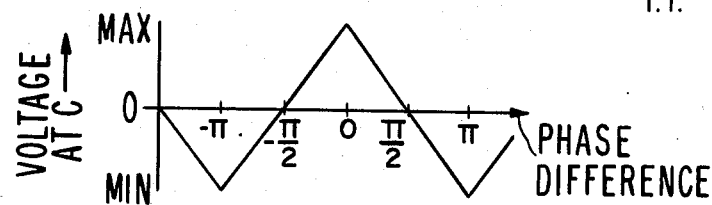
FIG. 2 is a graph of voltage at the output of differential amplifier 17 as a function of the phase difference between the input signal 2 and the clock 7.

The output of amplifier 17 ("point C") is shown in FIG. 2 as a function of the phase difference between signal 2 and clock 7. FIG. 2 illustrates the case where the input signal-to-noise ratio is low. As the signal-to-noise ratio increases, the response becomes more rectangular. When signal 2 is locked onto clock 7, the phase difference is 0, and the voltage at point C is MAX, a maximum equal to one-half of that voltage on signal 33 which represents a logical high. When signal 2 and clock 7 are 180° out of phase, the voltage at C is MIN, a minimum equal to minus one-half of that voltage on signal 33 which represents a logical high. This 180° out-of-phase condition is further illustrated in the lower two waveforms of FIG. 7, showing the Q outputs of flip-flops 9 and 11, respectively. It can be seen that these outputs are the reverse of what they were for the lock condition.

Returning to FIG. 1, comparator 19 is used to determine whether or not circuit 12 is in lock. A pre-selected threshold voltage $V_{REF}$ is set by means of potentiometer 21. $V_{REF}$ is set according to the designer's choice as to when lock shall be declared, as a function of the amount of noise present and other factors. Thus, for example, if $V_{REF}$ is set to be equal to MAX/2, a lock will be declared (by means of comparator 19 outputting a logical 1) whenever the phase difference is between pi/4 and −pi/4.

FIG. 4 shows one channel (I or Q) of a QPSK waveform 4 after demodulation and filtering, in which the demodulator has improperly locked onto a sideband offset in frequency from the true carrier by ¼ of the modulating data rate. Sidebands are also present at frequency offsets equal to integral multiples of ¼ the data rate. In this case, the demodulated output is the sum of the two channels (I and Q), each amplitude modulated by the offset frequency (¼ the data rate). As a result, a portion of the signal amplitude now lies in a window between −A/2 and +A/2 sample point X. Clock 7 from the bit synchronizer has locked onto this waveform 4. Most bit synchronizer lock detectors would also indicate a lock condition when presented with such a waveform 4. However, the instant lock detector 12 will properly refuse to declare such a waveform 4 to be locked. This is because the X average is equal to the Y average. The voltage at point C will thus be zero, and therefore output 10 is a logical zero for any value of $V_{REF}$ greater than zero.

FIG. 5 is an alternative embodiment of the present invention in which the window comparator, comprising elements 23, 25, and 27, is different from that (3, 5) shown in FIG. 1. Signal 4 is fed to the inverting input terminal of comparator 23, whose non-inverting input terminal has been set to the high end of the amplitude window. Signal 4 is also fed to the non-inverting input terminal of comparator 25, whose inverting input terminal has been set to the low end of the amplitude window. In the example illustrated, the high and low ends of the amplitude window have been set to A/2 and −A/2, respectively. However, another amplitude window could easily be chosen as desired, depending upon the shape of the incoming waveform.

The digital outputs of comparators 23 and 25 are fed as inputs to NAND gate 27. The output of comparator 23 is high when the amplitude of signal 4 is less than A/2. Similarly, the output of comparator 25 is high when the amplitude of signal 4 is greater than −A/2. Thus the output 33 of NAND gate 27 is low when signal 4 is within the amplitude window; otherwise, it is high. This corresponds to the case of signal 33 of FIG. 1. The remainder of the FIG. 5 circuit is identical with that depicted in FIG. 1. If the polarities are reversed in comparators 23 and 25, NAND gate 27 is replaced by an AND gate.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. Apparatus for determining the presence of lock between an input signal and a clock, wherein the input signal is any random periodic amplitude-varying-wave binary signal having two information states represented by high and low amplitude levels, respectively, and the clock is a square wave having substantially the same period as the input signal, said apparatus comprising:

coupled to the input signal, means for sampling the amplitude of the input signal at time-periodic sampling points comprising a set of X sampling points and an interleaved set of Y sampling points;

coupled to an output of the sampling means, means for comparing amplitudes of the input signal sampled at the X sampling points with amplitudes of the input signal sampled at the Y sampling points; and coupled to an output of the comparing means, means for declaring lock when the amplitudes sampled at the X sampling points exceed the amplitudes sampled at the Y sampling points by a preselected threshold.

2. The apparatus of claim 1 wherein each X sampling point is separated from each Y sampling point by one half of a period of said clock.

3. The apparatus of claim 1 further comprising, coupled intermediate the sampling means and the comparing means, means for averaging:
   (a) the amplitudes sampled at the X sampling points, to form an X average, and
   (b) the amplitudes sampled at the Y sampling points, to form a Y average; wherein:
   the comparing means compares the X average with the Y average.

4. The apparatus of claim 3 wherein the declaring means declares lock when the X average exceeds the Y average by a preselected threshold.

5. The apparatus of claim 3 wherein the averaging means comprises a first low pass filter for determining the X average and a second low pass filter substantially identical to the first low pass filter for determining the Y average.

6. The apparatus of claim 1 wherein the sampling means comprises:
   a first flip-flop having an input coupled to a digitized representation of the amplitude of the input signal, wherein said first flip-flop is clocked by said clock and outputs a signal indicating the amplitudes of said digitized representation at the X sampling points; and
   a second flip-flop having an input coupled to said digitized representation, wherein said second flip-flop is clocked by the inverse of the clock and outputs a signal indicating the amplitudes of said digitized representation at the Y sampling points.

7. The apparatus of claim 6 wherein the digitized representation contains sufficient information to indicate whether the input signal is instantaneously at a data region or a transition region.

8. The apparatus of claim 1 wherein:
   the input signal is fed to a low pass filter having a smoothed output which is fed to the sampling means; and
   the sampling means comprises an analog-to-digital converter.

9. The apparatus of claim 1 wherein the sampling means comprises means, coupled to the input signal, for determining whether the amplitude of the input signal is within an amplitude window having a high point and a low point, wherein the high point is lower than the high amplitude level and the low point is higher than the low amplitude level.

10. An apparatus for determining lock between an input signal and a clock, wherein the input signal is any random periodic substantially-square-wave binary signal having two information states that are represented by high and low amplitude levels, respectively, said apparatus comprising:

coupled to the input signal, a low pass filter for smoothing and converting said input signal from substantially a square wave to an amplitude varying wave;

coupled to an output of the low pass filter, means for determining whether the instantaneous amplitude of the input signal is within an amplitude window having high and low points, wherein the high point is lower than the high amplitude level and the low point is higher than the low amplitude level;

coupled to an output of the determining means, sampling means for generating a first signal indicative of the relationship of the amplitude of the input signal with respect to the amplitude window at a set of X sampling points, said sampling means further generating a second signal indicative of the relationship of the amplitude of the input signal with respect to the amplitude window at a set of Y sampling points, wherein each X sampling point is separated from each Y sampling point by one half of a period of the clock;

coupled to the first signal, means for time averaging the amplitude of the first signal to produce an X average;

coupled to the second signal, means for time averaging the amplitude of the second signal to produce a Y average;

coupled to the two time averaging means, means for comparing the X average with the Y average to produce a difference signal indicative of the difference between the X average and the Y average; and coupled to the difference signal, means for declaring lock when the amplitude of said difference signal exceeds a preselected threshold value.

11. The apparatus of claim 10 wherein the determining means comprises a three-bit analog-to-digital converter.

12. The apparatus of claim 10 wherein the determining means comprises two comparators, each of which has an input coupled to the smoothed input signal and an output coupled to an input of a logical gate from the class of gates comprising AND gates and NAND gates.

* * * * *